(12) United States Patent
Pak et al.

(10) Patent No.: US 11,690,154 B2
(45) Date of Patent: Jun. 27, 2023

(54) NETWORK ADDRESSABLE LIGHTING DEVICE ARCHITECTURE

(71) Applicant: PoEWit Technologies, Inc., Fort Lauderdale, FL (US)

(72) Inventors: Victor Seung Bae Pak, San Mateo, CA (US); Dusan Jankov, Fort Lauderdale, FL (US); Steven Keith Latham, Bel Air, MD (US); Dubravka Manitasevic, Fort Lauderdale, FL (US)

(73) Assignee: POEWIT TECHNOLOGIES, INC., Fort Lauderdale, FL (US)

( * ) Notice: Subject to any disclaimer, the term of this patent is extended or adjusted under 35 U.S.C. 154(b) by 328 days.

(21) Appl. No.: 17/037,978

(22) Filed: Sep. 30, 2020

(65) Prior Publication Data

US 2022/0104331 A1 Mar. 31, 2022

(51) Int. Cl.
*H05B 47/185* (2020.01)
*H05K 1/02* (2006.01)
*H05K 1/14* (2006.01)
*H04L 12/10* (2006.01)

(52) U.S. Cl.
CPC ........... *H05B 47/185* (2020.01); *H04L 12/10* (2013.01); *H05K 1/0216* (2013.01); *H05K 1/144* (2013.01); *H05K 2201/042* (2013.01)

(58) Field of Classification Search
CPC ... H01P 5/12; H01P 1/184; H01P 3/08; H03H 7/21; H05K 1/144; H05B 47/185; H04L 12/10
See application file for complete search history.

(56) References Cited

U.S. PATENT DOCUMENTS 10,270,875 B1 * 4/2019 Kuo ...................... H04L 67/561
11,283,892 B1 * 3/2022 Kuo ....................... H04L 67/59

* cited by examiner

*Primary Examiner* — Kenneth B Wells
(74) *Attorney, Agent, or Firm* — Rimon PC; Mark S. Kaufman

(57) ABSTRACT

An network addressable lighting device that receives the input power from a power source (PSE), such as a network Power Over Ethernet (PoE) source, at a physical interface and data assembly PIDA and passes the signal directly to a second power assembly (PA) while the AC coupled high-speed data lines stay exclusively on the PIDA that contains the input and output physical interfaces, such as RJ interfaces. All power rails required to run the PIDA are converted on the PA and can then be sent back to the PIDA via low-cost conventional board stacker connectors. Movement of the high-current is done on the power assembly and not the data assembly where the sensitive communications primarily occur. The implementations thus provide an ideal separation of power and data structures to reduce EMI/EMC issues in a low cost and compact device.

8 Claims, 2 Drawing Sheets

NETWORK ADDRESSABLE LIGHTING DEVICE ARCHITECTURE

BACKGROUND

Traditionally, networked computing devices transmit, process, and receive data over a network and require a source of power that is external to the network. For example, a network router may be plugged into a wall outlet to be powered by 120 v power off of the conventional power grid. Recent advances in power efficiency has made it possible to provide various network devices that are addressable over a computer network without the need for power sources external to the network. For example, "Power over Internet" (PoE) refers to an architecture that passes electric power along with data on "twisted pair" Ethernet cabling. This allows a single cable to provide both a data connection and electric power to various networking and utility devices, such as Wireless Access Points (WAPs), cameras, sensors and lighting devices. There are several common techniques for transmitting power over Ethernet cabling. Three of them have been standardized by Institute of Electrical and Electronics Engineers (IEEE) standard IEEE 802.3 since 2003.

Implementation of electronic systems that include electric power and high-speed differential data lines have several unique issues that must be resolved. One of those issues is the relative proximity of any differential-pair controlled impedance structures and supporting power structures for a device. This problem can be addressed by using a relatively large form factor to allow for a relatively large physical distance between the data and power systems of the device to thereby provide isolation and thus reduce noise in compliance with FCC Electromagnetic Interference and Electromagnetic Coupling (EMI/EMC) requirements. In systems that require a small a compact device, such physical distance is not always possible.

One solution is to split the total system into multiple physical components, each known as a "Printed Circuit Assembly (PCA), so that the surface total surface area of the multiple PCAs is sufficient to provide the requisite distance while maintaining a small "footprint" of the device, i.e. the area of the device as viewed from the top of the device. However, this approach introduces an additional problem. Connectors used between the PCAs must be specially designed to pass high-speed data signals between the PCAs. Differential signals are used almost exclusively for high-speed data lines due to lower voltage levels (+1/−1) versus 3.3V for low voltage single-ended data. To implement this arrangements, the design must hold both traces that are part of the differential structure to approximately 7 thousandth of an inch in width and keep them about 5 thousandth of an inch apart (this geometry is based on the PCB layer thickness). This impedance cannot be held while passing through a standard board-to-board connector so signal imperfections are a result. Although these connectors are available, differential data line structures are difficult to hold to tolerance when moving between assemblies and the cost for high-speed matched impedance connectors is much higher than standard board-to-board stacker connectors.

SUMMARY

The disclosed implementations overcome the above-identified disadvantages of the prior art by providing a novel design that receives the input power from a power source (PSE), such as a PoE device over a communications network, at a physical interface and data assembly (PIDA) and passes the power directly to a separate power assembly (PA) while the AC coupled high-speed data lines stay exclusively on the PIDA that contains the input and output physical interfaces, such as RJ interfaces. All power rails (various voltages) required to run the PIDA are converted on the PA and can then be sent back to the PIDA via low-cost conventional board stacker connectors. This solution allows for the use of low-cost connectors, with DC current requirements that are easily met, while movement of the high-current is done on the power assembly and not the data assembly where the sensitive communications primarily occur. The implementations thus provide an ideal separation of power and data structures to reduce EMI/EMC issues in a low cost and compact device.

One disclosed implementation is a network addressable lighting device having a logical network address based on a network addressing scheme and being configured for connection to a computer network through a cable that transmits electric power for powering one or more lighting elements of the lighting device and control data for addressing and controlling the lighting device, the lighting device comprising; a data printed circuit assembly defined on a first board and including a hybrid interface configured to connect to the cable and receive the electric power and the control data from a networked device, wherein the hybrid interface decouples the electric power from the control data, the data printed circuit further comprising a driver corresponding to the one or more lighting elements and at least one logic element for controlling a state of the driver based on the control data; a power printed circuit assembly defined on a second board that is separate from the first board and including a first power input element electrically coupled to the hybrid interface, via a first board to board stacker connector, to receive the electric power and the decoupled control data and separate the electric power from the decoupled data, wherein the power printed circuit assembly also includes a first power conversion element configured to convert the power to a first voltage that is appropriate for powering the driver and a second power conversion element to convert the power to a second voltage that is appropriate for the at least one logic element; wherein the data printed circuit assembly includes a second power input element for receiving power at the second voltage, via a second board to board stacker connector, from the second power conversion element, via the second board to board stacker connector, to provide power to the at least one logic element and power at the first voltage to provide power to the driver; and wherein the first power first power input element and the second power input element are physically remote from one another whereby EMI and EMC is reduced.

BRIEF DESCRIPTION OF THE DRAWINGS

The foregoing summary, as well as the following detailed description of the invention, will be better understood when read in conjunction with the appended drawings. For the purpose of illustrating the invention, the drawings illustrate various implementations. It should be understood, however, that the invention is not limited to the precise arrangements and instrumentalities shown in the drawings in which.

DETAILED DESCRIPTION

Figure 1:
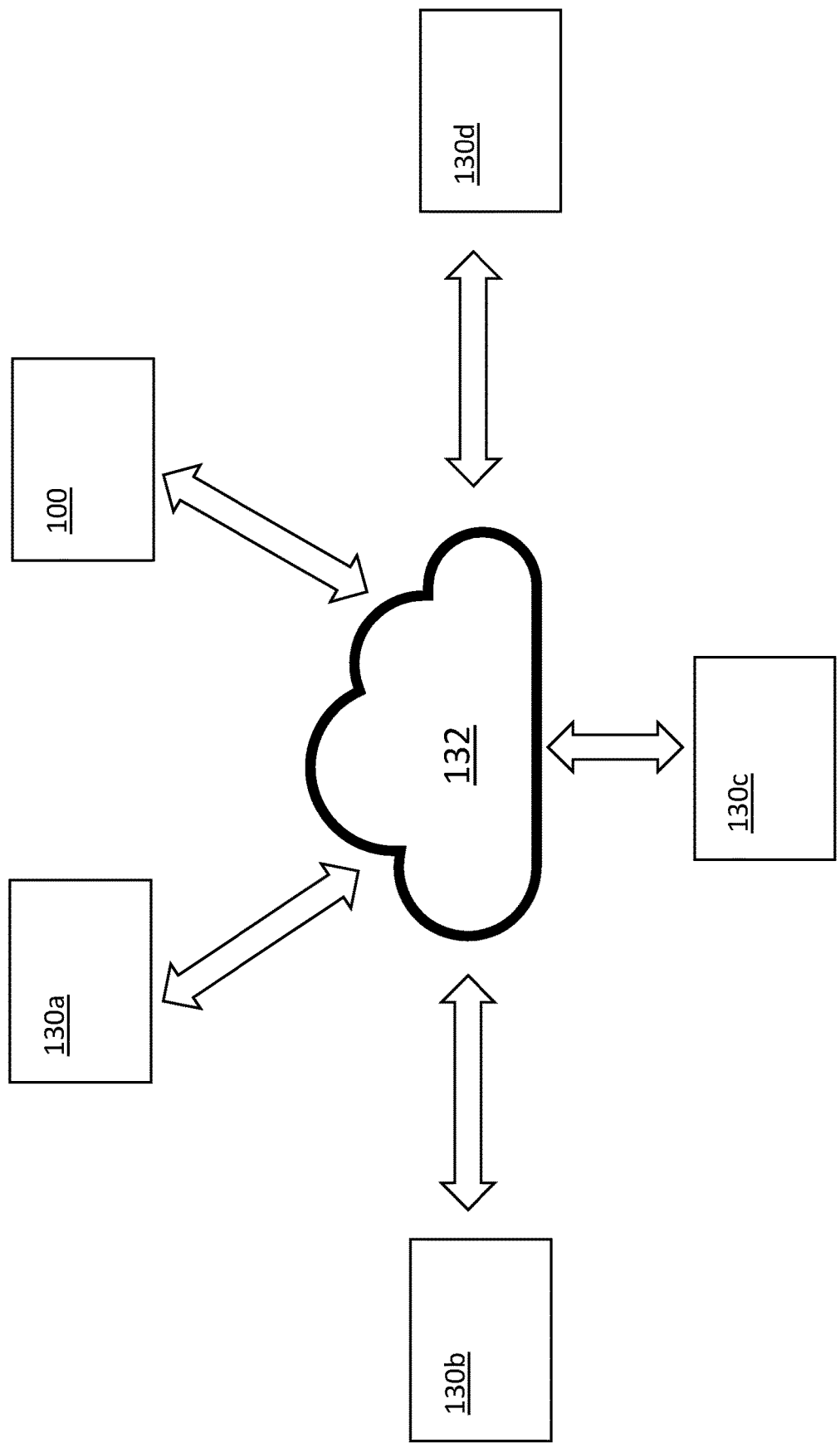
FIG. 1 is a schematic illustration of a computer network architecture including at least one device in accordance with disclosed implementations and other network devices.

Certain terminology is used in the following description for convenience only and is not limiting. The words "bottom," "top," "lower" and "upper" designate directions in the drawings to which reference is made. Unless specifically set forth herein, the terms "a," "an" and "the" are not limited to one element but instead should be read as meaning "at least one." The terminology includes the words noted above, derivatives thereof and words of similar import.

As noted above, devices receiving data and power over a computer network cable, such as PoE devices can communicate with other devices over a computer network. FIG. 1 illustrates device 100, in accordance with a disclosed implementation, in a networked architecture with other devices 130a, 130b, 130c, and 130d. The devices communicate over computing network 132, an Ethernet network for example. Devices 130a-d can be any type of network device such as routers, lighting devices, sensors, general purpose computing devices, mobile phones, or the like. Devices 130a-d can be the same as, or similar to, device 100 which is described in detail below. Each device can be addressable over network 132 and at least some of the devices can receive both operating power and data over network 132 in the manner described herein. Of course, some of devices 130a-d can be coupled to network 132 wirelessly and/or over the internet to provide communication with device 100.

Figure 2:
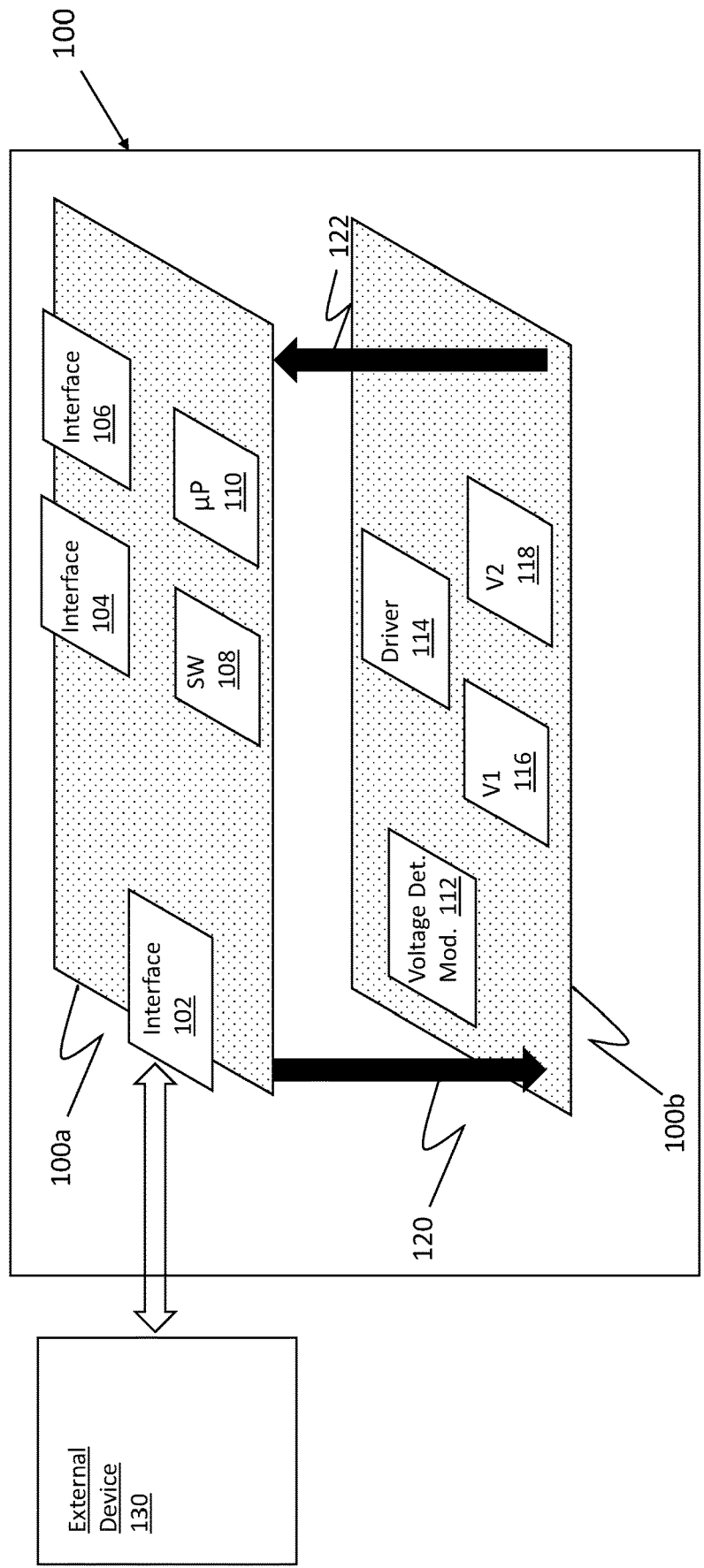
FIG. 2 is a schematic illustration of a network addressable lighting device in accordance with a disclosed implementation.

FIG. 2 is a schematic illustration of a network addressable lighting device 100. For example, the lighting device can be a PoE device. Lighting device 100 includes data assembly 100a and power assembly 100b. Each of data assembly 100a and power assembly 110b can be implemented as a separate PCA. Connectors 120 and 122 electrically couple components of data assembly 100a and power assembly 110b to one another in the manner described in detail below. The electrical connections between elements are not illustrated in detail in FIG. 2 but would be readily apparent to one of ordinary skill in the art of electric circuits based the disclosure herein. Significantly, the design described herein permits the use of low-cost connectors, with DC current requirements that are easily met, as connectors 120 and 122.

Data assembly 100a includes electrical interfaces 102, 104, and 106. As an example, interfaces 102, 104, and 106 can include a modular connector compliant with the RJ 45 standard. Data assembly 100a also includes network data switch 108, a gigabit ethernet switch for example, and microprocessor 110. Network data switch 108 routes control data in a conventional manner. Microprocessor 110 processes data in accordance with preprogrammed software to control operation of the device and the status of the powered device, such as one or more lighting elements in this example, as described below.

Power assembly module 100b includes voltage determination module 112, driver 114, V1 voltage converter 114, and V2 voltage converter 118. The combined power and data signal is received from external device 130 (which can be one of devices 13-a-d of FIG. 1) at interface 102. External device 130 can be a PoE networking device at interface 102. For example, the combined signal can include a 48-57 v power signal and high speed data, transmitted together on a twisted pair cable. The data is decoupled from the power signal and then the entire signal is transmitted to power assembly 100b through connector 120.

The signal transmitted through connector 120 is received by voltage determination module 112. For example, voltage determination module 112 can be a PoE module that interrogates a handshake signal in the data signal to determine the voltage(s) of the power signal. Voltage determination module 112 can include and infinite diode circuit and all filtering required to produce a clean voltage, 58 v for example. The clean voltage is supplied to V1 voltage convertor 116 and V2 voltage convertor 118 which respectively transform the voltage to 1.2 v and 3.3 v, or any other appropriate voltages determined by voltage determination module 112. Driver 114 will receive the 57 v signal to power one or more lighting elements (or other utility element such as a camera, sensor, or the like) under control of microprocessor 110. The 1.2 voltage signal will be used to power gigabit switch 108 and the 3.3 voltage signal will be used to power microprocessor 110.

All three voltages, the 1.2 voltage signal, the 3.3 voltage signal and the clean 57 v signal, are transmitted through connector 122 to data assembly 100a. Significantly, the voltage signals are received on data assembly 100a at a physical location that is remote from interface 102, where the original signal was received. In other words, there is sufficient physical distance between interface 102 and the termination of connector 122 on data assembly 100a to avoid significant EMI/EMC issues. Power and high speed data can be respectively transmitted to other devices in the network via interface 104 and interface 106. The design of the implementation described above provides isolation between power and data transmission lines, avoids all power conversion on data assembly 100a, and controls impedance in a compact package without the need for specialized, and expensive, connectors between PCAs.

One of ordinary skill in the art will be able to implement the invention based on the disclosure herein. For example, one of skill in the art would readily understand how to implement electrical connection of the various elements on PCAs without undue experimentation. It will be appreciated by those skilled in the art that changes could be made to the implementations described herein without departing from the broad inventive concept thereof. It is understood, therefore, that the invention is not limited to the particular disclosed implementations but includes modifications within the spirit and scope of the invention as defined by the appended claims.

What is claimed:

1. A network addressable lighting device having a logical network address based on a network addressing scheme and being configured for connection to a computer network through a cable that transmits electric power for powering one or more lighting elements of the lighting device and control data for addressing and controlling the lighting device, the lighting device comprising;

a data printed circuit assembly disposed on a first board and including a hybrid interface configured to connect to the cable and receive the electric power and the control data from a networked device, wherein the hybrid interface decouples the electric power from the control data, the data printed circuit further comprising a driver corresponding to the one or more lighting elements and at least one logic element for controlling a state of the driver based on the control data;

a power printed circuit assembly disposed on a second board that is separate from the first board and including a first power input element electrically coupled to the hybrid interface, via a first board to board stacker connector, to receive the electric power and the control data and separate the electric power from the control data, wherein the power printed circuit assembly also includes a first power conversion element configured to convert the power to a first voltage that is appropriate for powering the driver and a second power conversion element to convert the power to a second voltage that is appropriate for the at least one logic element;

wherein the data printed circuit assembly includes a second power input element for receiving power at the second voltage, via a second board to board stacker connector, from the second power conversion element, via the second board to board stacker connector, to provide power to the at least one logic element and power at the first voltage to provide power to the driver; and wherein the first power first power input element and the second power input element are physically remote from one another whereby Electromagnetic Interference (EMI) and Electromagnetic Coupling (EMC) is reduced.

2. The device of claim 1, wherein the data printed circuit assembly further includes a network switch.

3. The device of claim 2, further comprising a third power conversion element to convert the power to a third voltage that is appropriate for the network switch.

4. The device of claim 1, wherein the power input element comprises a voltage determination module that reads handshake data of the control data to determine voltages required for operation and includes a diode filter to filter noise from the electric power.

5. The device of claim 1, wherein the driver is electrically coupled to the one or more lighting elements.

6. The device of claim 1, wherein the at least one logic element includes a microprocessor executing software instructions.

7. The device of claim 1, wherein the network addressable lighting device is compliant with a Power Over Ethernet standard.

8. The device of claim 1, further comprising a housing surrounding the data printed circuit assembly and the power printed circuit assembly and wherein one of the data printed circuit assembly and the power printed circuit assembly is mounted in spaced relation above the other of the data printed circuit assembly and the power printed circuit assembly.

* * * * *